United States Patent
Farley

(10) Patent No.: US 6,859,089 B2
(45) Date of Patent: Feb. 22, 2005

(54) POWER SWITCHING CIRCUIT WITH CONTROLLED REVERSE LEAKAGE

(75) Inventor: Joseph D. Farley, Villeneuve Loubet (FR)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/726,286

(22) Filed: Dec. 2, 2003

(65) Prior Publication Data

US 2004/0239403 A1 Dec. 2, 2004

(30) Foreign Application Priority Data

May 30, 2003 (EP) .............................................. 03291302

(51) Int. Cl.[7] .............................................. H03K 17/56
(52) U.S. Cl. ...................................... 327/427; 327/437
(58) Field of Search ........................ 327/427, 430–437, 327/534, 538, 541–546; 323/312, 316

(56) References Cited

U.S. PATENT DOCUMENTS

| | | | |
|---|---|---|---|
| 4,529,897 A | 7/1985 | Suzuki et al. | |
| 5,512,814 A | * 4/1996 | Allman | .......................... 323/267 |
| 6,100,719 A | 8/2000 | Graves et al. | |
| 6,421,262 B1 | * 7/2002 | Saxelby et al. | .............. 363/127 |
| 6,580,258 B2 | * 6/2003 | Wilcox et al. | .............. 323/282 |
| 2002/0021164 A1 | 2/2002 | Fugate et al. | |

* cited by examiner

*Primary Examiner*—My-Trang Nu Ton
(74) *Attorney, Agent, or Firm*—Ronald O. Neerings; Wade James Brady, III; Frederick J. Telecky, Jr.

(57) ABSTRACT

A power switching circuit including an MOS power switching transistor (P1) is disclosed. The power switching transistor (P1) has a body node that is selectably biased to either its source or its drain, depending upon a comparison of the voltage at the circuit input (IN) relative to the voltage at the circuit output (OUT). In a reverse voltage situation in which the output voltage exceeds the input voltage, a first body node switching transistor (P11) connected between the body node of the power switching transistor (P1) and its source is turned off by a voltage corresponding to the output voltage, as conducted from the drain of the power switching transistor (P1) through a pull-down device (P5) in an inverter. Also in this reverse voltage situation, the gate of the power switching transistor (P1) is isolated from a control input (ON_/OFF) by series pass transistors (N0, N1; P12, P13), and the power switching transistor (P1) is held off by a bias transistor (P10), with a gate voltage also corresponding to the output voltage.

18 Claims, 1 Drawing Sheet

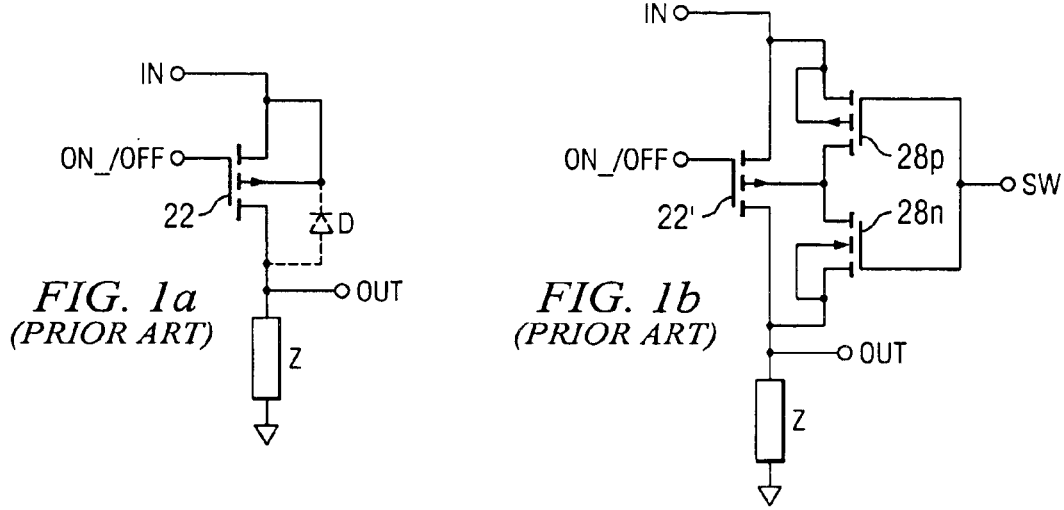
FIG. 1a
(PRIOR ART)
FIG. 1b
(PRIOR ART)
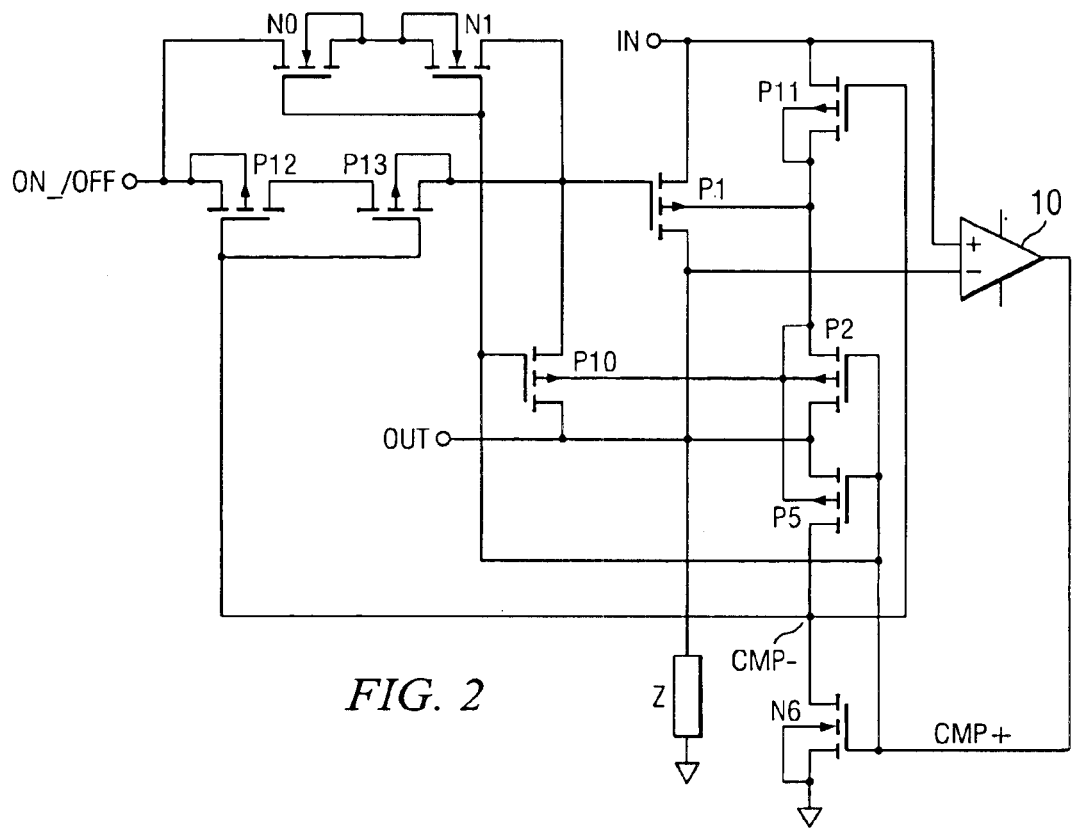
FIG. 2

POWER SWITCHING CIRCUIT WITH CONTROLLED REVERSE LEAKAGE

This application claims priority under 35 USC § (e)(1) of European Application Number 03291302.2 filed May 30, 2003.

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

This invention is in the field of semiconductor integrated circuits, and is more specifically directed to metal-oxide-semiconductor (MOS) power transistor switches.

Many modern electronic devices and systems ultimately rely upon the controlled switching of high power levels to a load. For example, electronic devices that produce audio signal output require the controlled switching of significant levels of energy (current or voltage) to a physical speaker. Control systems also require the switching of significant energy to electronically operated machinery and the like. Solid state transistors effecting such power switching are now in widespread use, due to advances in the technology.

In order to reduce the cost of the overall device or system, it is of course desirable to integrate as much of the solid state circuitry of the device or system into fewer integrated circuits, ultimately into a single integrated circuit. In recent years, a preferred device technology for accomplishing such integration has been metal-oxide-semiconductor (MOS) technology, preferably complementary metal-oxide-semiconductor (CMOS) technology, which implements both p-channel and n-channel MOS transistors, as is fundamental in the art. It is therefore desirable to implement power switching by way of CMOS technology, to obtain the benefits of very large scale integration.

FIG. 1a schematically illustrates a conventional MOS power switching circuit including power switching transistor 22. In this simplified arrangement, power switching transistor 22 is a p-channel MOS transistor, having its source connected to input IN to receive a high power signal, and its drain connected to pull-down load Z at output OUT. Power switching transistor 22 is sufficiently large, in terms of channel length and width, enabling it to conduct large currents and to handle large drain-source voltages. The body node, or channel node, of power switching transistor 22 is connected to its source in this conventional implementation; this connection is commonly referred to as the "back-gate" bias. Load Z is connected between the drain of power switching transistor 22 and ground, and presents an impedance so that energy from input IN is transferred to output OUT when power switching transistor 22 is turned on, while pulling down output OUT when power switching transistor 22 is off.

The gate of power switching transistor 22 is connected to control line ON__/OFF, which applies a control signal to turn the device on and off. Because power switching transistor 22 is p-channel, a low level on control line ON__/OFF relative to the voltage on input IN will turn on power switching transistor 22, to conduct current from input IN to load Z. Conversely, a high voltage on control line ON__/OFF, within a threshold voltage of the voltage on line IN, will turn off power switching transistor 22. The voltage at output OUT is thus pulled toward the high voltage of input IN when power switching transistor 22 is on, and is pulled toward ground through load Z when it is off. The circuit of FIG. 1a is often used to generate large drive currents, of on the order of hundreds of milliamperes or greater.

In normal operation, the voltage at output OUT is lower than the voltage at input IN. In this typical condition, the source-drain leakage through power switching transistor 22 when off is substantially zero, at most in the sub-microampere range. It is of course desirable that the source-drain leakage be at these low levels whenever power switching transistor 22 is off, especially when implemented into a battery-powered device such as a wireless telephone handset.

However, it is possible for the voltage at output OUT to be higher than the voltage at input IN. One such fault situation occurs when power switching transistor 22 is turned off and the voltage at input IN then falls, so that the voltage at output OUT at the drain of power switching transistor 22 stays higher than that of the newly fallen voltage at the source of power switching transistor 22. This can occur if an external device connected to output OUT, such as an electrolytic coupling capacitor, maintains the voltage at output OUT for some time after power switching transistor 22 is turned off. Another cause of a reverse voltage condition is the external driving of output OUT to a voltage above that of input IN.

In these situations, the drain voltage of power switching transistor 22 when off will be higher than the voltage at its source. This bias condition can cause significant leakage from drain to source, considering that parasitic diode D at the p-n junction between the drain and body node of power switching transistor 22 will be forward biased due to the body node being connected to the lower voltage at the source of power switching transistor 22. The resulting reverse leakage can be significant, in some cases large enough to damage power switching transistor 22.

To address this possibility for large drain-source leakage in power switching transistors, it is known to switch the body node connection of the power switching MOS transistor in response to circuit conditions. FIG. 1b illustrates this conventional concept in a generic fashion, in which a pair of transistors 28p, 28n selectably connect the body node of power switching transistor 22' to either its source (at input IN) or drain (at output OUT) according to the state of the circuit.

In this conventional switched body node arrangement, PMOS transistor 28p has its source connected to the source of power switching transistor 22', and its drain connected to the body node of transistor 22' and to the drain of NMOS transistor 28n. NMOS transistor 28n has its source connected to the drain of power switching transistor 22'. Each of transistors 28p, 28n has its respective body node connected to its source, and the gates of transistors 28p, 28n are connected together to line SW. The state of line SW may be controlled by the state of line ON__/OFF at the gate of power switching transistor 22', or alternatively may be driven from a comparator in response to the relative voltage of input IN to output OUT.

According to this conventional approach, transistors 28p, 28n are controlled so that the body node of power switching transistor 22' is connected to either the drain or source of transistor 22', whichever is at a higher voltage than that of the body node of power switching transistor 22'. This controlled switching is intended to ensure that a reverse-biased diode is always in place between the source and drain of transistor 22'. In normal operation, where the voltage at input IN is equal to or higher than the voltage at output OUT, line SW will be maintained low (e.g., by line ON__/OFF being low, or by the output of a comparator indicating that the voltage at output OUT is below that of input IN). This turns off NMOS transistor 28n, and turns on PMOS transistor 28p, connecting the body node of power switching transistor 22' to its source.

Conversely, to avoid reverse leakage, line SW is driven high, to about the voltage at input IN. This turns on NMOS transistor 28n and turns off transistor 28p, connecting the body node of power switching transistor 22' to its drain. Line SW may be driven high by line ON__/OFF going high to turn off power switching transistor 22'. Alternatively, a comparator may drive line SW high in response to the voltage at output OUT going above that at input IN.

However, it has been observed, in connection with this invention, that this conventional body node switching arrangement has significant limitations. Referring to FIG. 1b, a voltage at output OUT that is significantly higher than that at input IN and on line SW can cause leakage through the series connection of transistors 28p, 28n, even with PMOS transistor 28p turned off. Considering that transistor 28n effectively shorts the body node of transistor 22' to its drain when on, transistor 28p can turn on if its drain voltage exceeds the voltage at its source (input IN) by the sum of its gate-to-source voltage plus its threshold voltage. If transistor 28p turns on, the reverse leakage through the series chain of transistors 28n, 28p, from output OUT to input IN, can be significant, even in this conventional arrangement in which the body node bias of power switching transistor 22' is controlled.

It has also been observed that overvoltage device specifications have become more stringent, relative to the manufacturing technology. Modern devices are required to guarantee extremely low reverse leakage levels, even under significant reverse voltage conditions.

BRIEF SUMMARY OF THE INVENTION

It is therefore an object of this invention to provide a power switching transistor circuit in which the power switching transistor exhibits extremely low levels of reverse leakage.

It is a further object of this invention to provide such a circuit in which the extremely low reverse leakage is attained even at relatively large externally applied output voltages.

It is a further object of this invention to provide such a circuit in which the body node of the power switching transistor is reliably controlled to ensure such extremely low reverse leakage performance.

Other objects and advantages of this invention will be apparent to those of ordinary skill in the art having reference to the following specification together with its drawings.

The present invention may be implemented into a control circuit for a metal-oxide-semiconductor (MOS) power switching transistor. A pair of MOS transistors are provided for selectably switching the body node of the MOS power switching transistor to its drain or source, responsive to whether the drain or source is at a higher voltage. In operation, one of the pair of MOS transistors will turn on, for example in response to a comparison of the drain and source voltages of the power switching transistor. Additional transistors are provided to also fully turn off the other one of the MOS transistor, holding it off even in the event of an excessive reverse voltage across the power switching transistor. Additional circuitry isolates the gate of the power switching transistor from its control signal in the reverse voltage situation, and holds the power switching transistor off in this state.

BRIEF DESCRIPTION OF THE SEVERAL VIEWS OF THE DRAWING

FIGS. 1a and 1b are electrical diagrams, in schematic form, of a conventional power switching transistor and of conventional circuitry for controlling its back-gate bias.

FIG. 2 is an electrical diagram, in schematic form, of a power switching circuit constructed according to the preferred embodiment of the invention.

DETAILED DESCRIPTION OF THE INVENTION

The present invention will be described in connection with its preferred embodiment, namely as implemented by way of complementary metal-oxide-semiconductor (CMOS) technology. More particularly, this description is provided for the example in which a p-channel metal-oxide-semiconductor (MOS) transistor serves as the power switching transistor. This particular description is provided because it is contemplated that this invention is especially beneficial when implemented in such an fashion and application. It will be understood by those skilled in the art having reference to this specification that this invention will have benefits when implemented in other contexts, and according to other alternative technologies. Accordingly, it is to be understood that the following description is provided by way of example only, and is not intended to limit the true scope of this invention as claimed.

Referring now to FIG. 2, a power switching circuit according to the preferred embodiment of the invention will now be described. In this example, power switching transistor P1 is a p-channel MOS (PMOS) transistor, having its source connected to input IN and its drain connected to load Z, at output OUT. Load Z is connected between output OUT at the drain of power switching transistor P1 and ground, in this example. The gate of power switching transistor P1 is coupled to control line ON__/OFF, via the source/drain paths of NMOS series transistors N0, N1 in parallel with the source/drain paths of PMOS series transistors P12, P13. In normal operation, NMOS series transistors N0, N1 and PMOS series transistors P12, P13 are all on, so that the state of control line ON__/OFF directly controls the on-off state of power switching transistor P1.

It will be understood by those skilled in the art that power switching transistor P1 may alternatively be realized by an n-channel MOS (NMOS) device. In such a complementary realization, it is contemplated that the channel conductivity type of each of the transistors, and the relationships of the various voltages, in the circuit of FIG. 2 will also be complementary to that shown. It is further contemplated that those skilled in the art having reference to this specification will be readily able to effect such a complementary implementation of this exemplary circuit.

In its basic operation, the input power to be switched is applied to input IN from elsewhere in the system incorporating the power switching circuit of FIG. 2. For example, input IN may supply power for driving audio speakers that are connected to output OUT, such as in a wireless telephone handset or in an audio amplifier circuit for a computer or audio system. Of course, many applications of power switching circuits are known in the art, in connection with which this preferred embodiment of the invention is suitable. The state of control line ON_/OFF is controlled by the system to determine the application of this power to output OUT. For example, a pulse width modulator may control power switching transistor P1 by controlling the state of control line ON_/OFF in a pulse width modulated fashion. In the example of FIG. 2, a low level on control line ON_/OFF will turn on power switching transistor P1, applying the power from input IN to load Z and driving output OUT accordingly. Conversely, a high level on control line ON_/OFF will turn off power switching transistor P1, isolating output OUT from input IN.

Referring back to the construction of the preferred embodiment of this invention, the body node connection, or back-gate bias, of power switching transistor P1 is controlled by way of PMOS transistor P11 and PMOS transistor P2. PMOS transistor P11 has its source connected to input IN, and its drain and body node connected to the body node of power switching transistor P1. Conversely, PMOS transistor P2 has its source, and its body node, connected to the body node of power switching transistor P1, and its drain connected to output OUT. PMOS transistor P5 and NMOS transistor N6 have their source-drain paths connected in series with that of PMOS transistor P2, creating a series path from output OUT to ground. In this example, PMOS transistor P5 has its source connected to the drain of PMOS transistor P2, and its drain connected to the drain of NMOS transistor N6 in CMOS inverter fashion; the source of NMOS transistor N6 and its body node are at ground. The gate of PMOS transistor P11 is connected to the output of this CMOS inverter at the drains of PMOS transistor P5 and NMOS transistor N6, shown as node CMP− in FIG. 2. The body nodes of PMOS transistors P2, P5, and also that of PMOS transistor P10, are connected in common to the source of PMOS transistor P2, which is at the same potential as the switched body node of power switching transistor P1.

The gates of PMOS transistors P2, P5, and the gate of NMOS transistor N65 are driven by the output of comparator 10, at node CMP+. Comparator 10 may be a conventional voltage comparator circuit as known in the art. Comparator 10 has a non-inverting input connected to input IN, at the source of power switching transistor P1, and an inverting input connected to output OUT, at the drain of power switching transistor P1. Comparator 10 thus produces an output signal having a polarity corresponding to the polarity of the voltage at input IN relative to output OUT, and thus to the polarity of the source voltage of transistor P1 to its drain voltage. The output of the inverter of PMOS transistor P5 and NMOS transistor P6, at node CMP−, is complementary to the output of comparator 10, at node CMP+.

The combination of PMOS transistors P11, P2, P5 and NMOS transistor N6 controls the voltage to which the body node of power switching transistor P1 is biased, in response to the output of comparator 10. This operation will be described in further detail below.

The power switching circuit according to the preferred embodiment of the invention also includes the function of isolating the gate of power switching transistor P1 from control line ON_/OFF, in the event that the voltage at output OUT exceeds the voltage at input IN. To realize this function, a parallel pair of complementary series transistors couple control line ON_/OFF to the gate of power switching transistor P1, as mentioned above. NMOS transistor N0 has its source connected to control line ON_/OFF, and its drain connected to the drain of NMOS transistor N1; the source of NMOS transistor N1 is connected to the gate of power switching transistor P1. The body nodes of each of NMOS transistors N0, N1 are connected to their respective drains, and the gates of transistors N0, N1 are connected in common to node CMP+, at the output of comparator 10. The source/drain paths of PMOS transistors P12, P13 are in parallel with those of NMOS transistors N0, N1, with the source of PMOS transistor P12 connected to control line ON_/OFF, the drains of PMOS transistors P12, P13 connected together, and the source of PMOS transistor P13 connected to the gate of power switching transistor P1. The body nodes of PMOS transistors P12, P13 are connected to their respective sources, and the gates of PMOS transistors P12, P13 are connected in common to node CMP−, at the output of the inverter formed by PMOS transistor P5 and NMOS transistor N6. As such, the gates of the parallel complementary NMOS transistors N0, N1 and PMOS transistors P12, P13 receive complementary signals relative to one another, as will be described in detail.

Also according to the preferred embodiment of the invention, power switching transistor P1 is held off in the event that the voltage at output OUT exceeds the voltage at input IN. This function is realized by PMOS transistor P10, which has its source connected to the gate of power switching transistor P1, its drain connected to output OUT, and its gate driven from node CMP+ at the output of comparator 10, in common with the gates of PMOS transistors P2, P5 and NMOS transistor N6. As mentioned above, the body node of PMOS transistor P10 is connected in common with the body nodes of PMOS transistors P2, P5 and power switching transistor P10.

In normal operation, the voltage at input IN is higher than the voltage at output OUT. Comparator 10 in turn issues a positive polarity output at node CMP+, at a sufficient voltage to turn on NMOS transistors N6, N0, and N1, and turn off PMOS transistors P2, P5. This causes the voltage at node CMP−, at the drains of transistors P5, N6, to be pulled to ground by NMOS transistor N6. With node CMP− low, PMOS transistor P11 is turned on, biasing the body node of power switching transistor P1 to its source at the higher voltage at input IN (i.e., higher than the voltage at output OUT), considering that PMOS transistor P2 is turned off by the high voltage at node CMP+. The body nodes of PMOS transistors P2, P5, P10 are also biased to the higher voltage at input IN. The high voltage at node CMP+ and the low voltage at node CMP− also turns on all of NMOS transistors N0, N1 and PMOS transistors P12, P13, connecting the gate of power switching transistor P1 to control line ON_/OFF. PMOS transistor P10 is turned off by the high voltage at node CMP+, so that it does not affect the gate voltage of power switching transistor P1. Power switching transistor P1 is thus enabled to switch power from input IN to output OUT under the control of control line ON_/OFF.

In the reverse voltage fault condition in which output OUT is at a higher voltage than that of input IN, typically occurring after power transistor P1 is turned off by control line ON_/OFF, comparator 10 senses this relative voltage polarity condition, and in response drives a low level at node CMP+. This turns off NMOS transistor N6, and turns on PMOS transistor P5 so that the high voltage at output OUT is conducted through PMOS transistor P5 to appear at node CMP−, turning off PMOS transistor P11 and isolating the body node of power switching transistor P1 from its source at input IN. The low voltage at node CMP+ also turns on PMOS transistor P2, connecting the body node of power switching transistor P1 (and that of PMOS transistors P11, P2, P5, P10) to its drain, which is at the higher voltage of output OUT (i.e., higher than the voltage at input IN).

According to this preferred embodiment of the invention, the gate of power switching transistor P1 is also isolated from control line ON_/OFF in the reverse voltage condition. The low voltage at node CMP+ turns off NMOS transistors N0, N1, and the high voltage at node CMP− turns off PMOS transistors P12, P13, effecting this isolation. The low voltage at node CMP+ also turns on PMOS transistor P10, coupling the high voltage at output OUT to the gate of power switching transistor P1, ensuring that transistor P1 remains fully off in this reverse voltage state.

According to this embodiment of the invention, reverse leakage current is greatly reduced, even at relatively high reverse voltages. This is accomplished by the common biasing of the body nodes of PMOS transistors P10, P2, P5, along with the body node of power switching transistor P1, to the higher voltage at the drain of transistor P1 at output OUT, in the reverse voltage condition. Because the body nodes of each of these devices are biased to this highest voltage in the circuit, these devices are not vulnerable to undesirable turn-on, as in conventional circuits. In addition, because PMOS transistors P2, P5 are turned on by comparator 10, the higher voltage at output OUT is applied directly to the gate of PMOS transistor P11, ensuring that this device not only turns off but remains off, regardless of how high the voltage at output OUT is driven (short of overstress, of course).

Furthermore, because of the isolation of the gate of power switching transistor P1 from control line ON_/OFF, and because of the operation of PMOS transistor P10 actively driving the gate of transistor P1 to an off state, drain-source reverse leakage through power switching transistor P1 itself is also prevented. This is especially important in battery-backup situations, where the power switching function is intended to be disabled, and where leakage current is to be minimized to maximize battery life.

It is therefore contemplated that the power switching circuit according to the preferred embodiment of the invention, as described above, is capable of achieving extremely low reverse leakage currents, as low as the sub-microampere range. This excellent level of performance is attained while still using a single MOS power switching transistor, rather than requiring discrete devices to ensure low reverse leakage. This power switching circuit can therefore be efficiently realized in relatively small silicon area, especially considering that single MOS transistors are also still used to switch the body node of the power switching device.

Other advantages are also provided by the power switching circuit according to this embodiment of the invention. In particular, the body node biasing transistors share the same body node connection as the body node of the power switching transistor itself. This greatly reduces the required silicon area, as these transistors can all be realized in the same tank or well, thus eliminating the need not only for one or more additional tanks, but also the tank-to-tank spacing required for isolation of the body nodes. By sharing the same tank for these devices, the parasitic junction capacitance is reduced as is interconnect resistance, permitting faster switching of the circuit itself. The single tank for these devices also improves the immunity of the circuit to CMOS latchup.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A power switching circuit, comprising:
   a power switching transistor, having a source and a drain defining a source/drain path connected on a first side to an input of the power switching circuit and connected on a second side to an output of the power switching circuit, having a gate coupled to a control line of the power switching circuit, and having a body node;
   a first body node switching transistor, having a source/drain path connected between the body node and the first side of the source/drain path of the power switching transistor, and having a gate;
   a second body node switching transistor, having a source/drain path connected between the body node and the first side of the source/drain path of the power switching transistor, and having a gate;
   a comparator, for comparing the voltage at the input of the power switching circuit to the output of the power switching circuit, the output of the comparator coupled to the gate of the second body node switching transistor; and
   an inverter, biased between the output of the power switching circuit and circuit ground, having an input coupled to the output of the comparator, and having an output coupled to the gate of the first body node switching transistor, for applying a voltage at the gate of the first body node switching transistor corresponding to the output of the power switching circuit responsive to the voltage at the output of the power switching circuit being higher than the voltage at the input of the power switching circuit.

2. The power switching circuit of claim 1, wherein the inverter comprises:
   first and second complementary transistors, having their drains connected in common at the output of the inverter, having their gates connected in common to the output of the comparator, and having their source/drain paths connected in series between the output of the power switching circuit and circuit ground.

3. The power switching circuit of claim 2, wherein the body node of the power switching transistor is connected to the body nodes of the first and second body node switching transistors, and to the body node of the first complementary transistor.

4. The power switching circuit of claim 1, wherein the body node of the power switching transistor is connected to the body nodes of the first and second body node switching transistors.

5. The power switching circuit of claim 1, further comprising:
   a load, connected between the output of the power switching circuit and circuit ground.

6. The power switching circuit of claim 1, further comprising:
   pass transistor circuitry, for coupling the control line of the power switching circuit to the gate of the power switching transistor responsive to the output of the comparator.

7. The power switching circuit of claim 6, wherein the pass transistor circuitry comprises:
   at least one transistor of a first conductivity type, having a source/drain path connected between the control line of the power switching circuit and the gate of the power switching transistor, and having a gate coupled to the output of the comparator; and at least one transistor of a second conductivity type, having a source/drain path connected between the control line of the power switching circuit and the gate of the power switching transistor, and having a gate coupled to the inverter.

8. The power switching circuit of claim 6, further comprising:

a gate bias transistor, having a source/drain path connected between the gate of the power switching transistor and the second side of the source/drain path of the power switching transistor, and having a gate coupled to the comparator, for connecting the gate of the power switching transistor to the second side of the source/drain path of the power switching transistor responsive to the voltage at the output of the power switching circuit being higher than the voltage at the input of the power switching circuit.

9. The power switching circuit of claim 8, wherein the gate bias transistor has a body node connected to the body node of the power switching transistor and to the body nodes of the first and second body node switching transistors.

10. The power switching circuit of claim 1, wherein the power switching transistor, and the first and second body node switching transistors are each of a first conductivity type.

11. The power switching circuit of claim 10, wherein the source of the power switching transistor is connected to the input of the power switching circuit, and wherein the drain of the power switching transistor is connected to the output of the power switching circuit.

12. The power switching circuit of claim 11, wherein the inverter comprises:

a first transistor of the first conductivity type, having a gate coupled to the output of the comparator, having a source connected to the source, and having a drain;

a second transistor of a second conductivity type, having a drain connected to the drain of the first transistor at the output of the inverter, having a gate connected in common with the gate of the first transistor, and having a source connected to circuit ground.

13. The power switching circuit of claim 12, further comprising:

at least one transistor of the first conductivity type, having a source/drain path connected between the control line of the power switching circuit and the gate of the power switching transistor, and having a gate coupled to the output of the comparator; and at least one transistor of the second conductivity type, having a source/drain path connected between the control line of the power switching circuit and the gate of the power switching transistor, and having a gate coupled to the output of the inverter.

14. The power switching circuit of claim 13, further comprising:

a gate bias transistor of the first conductivity type, having a source connected to the gate of the power switching transistor, having a drain connected to the drain of the power switching transistor, and having a gate coupled to the comparator.

15. The power switching circuit of claim 14, wherein the gate bias transistor has a body node connected to the body node of the power switching transistor and to the body nodes of the first and second body node switching transistors.

16. A method of switching power from an input to an output by way of a power switching transistor, comprising the steps of:

responsive to a voltage at the input being higher than a voltage at the output, biasing a body node of the power switching transistor to a voltage corresponding to the voltage at the input by turning on a first body node switching transistor;

applying a control signal to the gate of the power transistor to couple the input to the output responsive to the control signal;

responsive to the voltage at the output being higher than the voltage at the input, biasing the body node of the power switching transistor to a voltage corresponding to the voltage at the output by turning on a second body node switching transistor; and also responsive to the voltage at the output being higher than the voltage at the input, turning of the first body node switching transistor by applying, to the gate of the first body node switching transistor, a voltage that corresponds to the voltage at the output.

17. The method of claim 16, further comprising:

responsive to the voltage at the output being higher than the voltage at the input, isolating the gate of the power switching transistor from the control signal.

18. The method of claim 17, further comprising:

responsive to the voltage at the output being higher than the voltage at the input, applying a voltage to the gate of the power switching transistor to turn it off.

* * * * *